United States Patent [19]
Inoue et al.

[11] Patent Number: 5,341,332
[45] Date of Patent: Aug. 23, 1994

[54] SEMICONDUCTOR MEMORY DEVICE CAPABLE OF FLASH WRITING AND METHOD OF FLASH WRITING

[75] Inventors: Kazunari Inoue; Toshiyuki Ogawa, both of Hyogo, Japan

[73] Assignee: Mitsubishi Denki Kabushiki Kaisha, Tokyo, Japan

[21] Appl. No.: 59,406

[22] Filed: May 11, 1993

[30] Foreign Application Priority Data

May 12, 1992 [JP] Japan ................... 4-119202

[51] Int. Cl.$^5$ ............. G11C 7/00; G11C 8/00
[52] U.S. Cl. ............. 365/189.01; 365/189.05; 365/230.05; 365/230.09; 365/238.5; 365/218
[58] Field of Search ........... 365/189.01, 189.05, 365/230.05, 230.09, 218, 238.5

[56] References Cited

U.S. PATENT DOCUMENTS

| | | | |
|---|---|---|---|
| 5,003,510 | 3/1991 | Kamisaki | 365/189.01 |
| 5,134,589 | 7/1992 | Hamano | 365/218 X |
| 5,140,553 | 8/1992 | Choi | 365/218 X |
| 5,155,705 | 10/1992 | Goto | 365/218 |
| 5,187,684 | 2/1993 | Hoshino | 365/189.01 X |
| 5,255,243 | 10/1993 | Kitazawa | 365/189.01 X |

FOREIGN PATENT DOCUMENTS 2-189790  7/1990  Japan ................. 365/189.01

*Primary Examiner*—Eugene R. LaRoche
*Assistant Examiner*—Son Mai
*Attorney, Agent, or Firm*—Lowe, Price, LeBlanc & Becker

[57] ABSTRACT

A semiconductor memory device having flash write mode and initialized mode functions includes a flash write signal generation circuit for generating flash write signals FW and /FW, and a plurality of switching circuits 30 each provided corresponding to one row in a memory cell arrays MA. The switching circuit 30 applies fixed data "0" or "1" to a memory cell connected to one row selected by a row decoder 10, in response to the flash write signal FW or /FW. Because it is not necessary to activate a column decoder when the flash write or the initialized mode operation is conducted, writing speed can be increased while power consumption can be reduced.

17 Claims, 12 Drawing Sheets

SEMICONDUCTOR MEMORY DEVICE CAPABLE OF FLASH WRITING AND METHOD OF FLASH WRITING

BACKGROUND OF THE INVENTION

1. Field of the Invention

The present invention relates generally to semiconductor memory devices and manufacturing methods thereof, and more specifically, to a semiconductor memory device allowing writing of data at a time to a plurality of memory cells connected to one word line and a operating method thereof.

2. Description of the Prior Art

Conventionally, there is known a method of writing same data to all of memory cells connected to one word line at a time for achieving high speed accessing to a semiconductor memory device (hereinafter the method will be referred to as flash write).

FIG. 7 is a block diagram showing a conventional dynamic semiconductor memory device. Referring to FIG. 7, the semiconductor memory device includes memory cells 1 arranged in a matrix, word lines 2 provided correspondingly to the rows of the matrix, and bit lines 3A on the side of BL and bit lines 3B on the side of /BL provided alternately and correspondingly to the columns of the matrix. The bit lines 3A and 3B are provided adjacent to each other in pairs. The memory cells 1 are each provided at a crossing point of a word line 2 and one of the bit lines 3A on the BL side and the bit lines 3B on the /BL side which are alternately arranged.

The semiconductor memory device includes external terminals 6A to 6G. Row and column address signals for a memory cell 1 to and from which data is input and output are input at the external terminal 6A. The external terminals 6B and 6C are provided with a /RAS (Row Address Strobe) signal and a /CAS (Column Address Strobe) signal, respectively which are clock signals for internally in taking the row and column address signals. The external terminals 6D and 6E each output and input a data signal. A /WE signal which is a clock signal for intaking an externally applied data signal inside is input at the external terminal 6F. The external terminal 6G is provided with a signal DSF (Data-in Special Flag) for designating a flash write mode.

The semiconductor memory device shown in FIG. 7 further includes, as a peripheral circuit for the memory cell array, an address buffer 7, an RAS buffer 8, a CAS buffer 9, a row decoder 10, a column decoder 11, a data input/output line 12, an input/output gate 13, a sense amplifier 14, a preamplifier 15, a main amplifier 16, an input data buffer 17, a WE buffer 18, a DSF buffer 21, and a flash write signal generation circuit 22. The address buffer 7 changes the level of a signal input to the external terminal 6A. The RAS buffer 8 changes the level of the /RAS signal applied to the external terminal 6B. The CAS buffer 9 changes the level of the /CAS signal applied to the external terminal 6C. The row decoder 10 is provided between the address buffer 7 and the word lines 2 and selects a designated word line 2 in response to a row address signal from the address buffer 7. The column decoder 11 is provided between the address buffer 7 and the bit lines 3A, 3B and selects a designated bit line pair 3A, 3B in response to a column address signal from the address buffer 7. The data input-/output line 12 input/outputs data to/from a memory cell 1. The input/output gate 13 is provided between the bit lines 3A, 3B and the input/output line 12 and has its one source/drain electrode connected to a bit line, its the other source/drain electrode connected to the input/output line 12, and its gate electrode connected to the column decoder 11. The sense amplifier 14 amplifies the potential difference between the bit lines 3A and 3B. The preamplifier 15 amplifies a data signal with a small potential difference appearing on the input/output line. The main amplifier 16 amplifies a data signal from the preamplifier 15 for output. The input/output data buffer 17 changes the level of data input to the external terminal 6E. The WE buffer 18 changes the level of an external write signal /WE applied to the external terminal 6F. The DSF buffer 21 changes the level of a flash write mode designation signal DSF applied to the external terminal 6G. The flash write signal generation circuit 22 generates a flash write signal FW in response to a signal output from the DSF buffer 21 and a row address strobe signal output from the RAS buffer 8.

FIG. 8 is a circuit diagram showing a flash write signal generation circuit 22 shown in FIG. 7. FIG. 9 is a timing chart for use in illustration of the operation of the flash write signal generation circuit 22 shown in FIG. 8.

Referring to FIG. 8, the flash write signal generation circuit 22 includes a logic gate 22a, a clocked inverter 22b, and inverters 22c–22f. The logic gate 22a is an OR gate in positive logic. The clocked inverter 22b inverts the output of logic gate 22a in response to a /RAS signal and an output signal from the inverter 22c. The inverters 22d and 22e constitute a latch circuit and hold the output level of the clocked inverter 22b. The inverter 22f inverts the output level of inverter 22d, and the resultant inverted output signal is output to a column decoder 11 as a flash write signal FW.

Now, referring to FIG. 9, the operation of the flash write signal generation circuit 22 shown in FIG. 8 will be described. At the time of usual operation, the DSF signal is at an L level, and the flash write signal FW is maintained at the level since the clocked inverter 22b does not invert an output signal if the /RAS signal rises.

Meanwhile, in a flash writing operation, the DSF signal is temporarily pulled to an H level, and the clocked inverter 22 detects the DSF signal (H level) in the falling timing of the /RAS signal and applies the H level to the inverters 22d and 22e. The inverters 22d and 22e latch the output of clocked inverter 22b (H level). The output of inverter 22d is inverted at the inverter 22f, and thus inverted signal is applied to the column decoder 11 as the flash write signal FW.

FIG. 10 is a flow chart for use in illustration of a usual operation of a semiconductor memory device as shown in FIG. 7, and FIG. 11 is a timing chart in a usual operation. FIG. 12 is a flow chart for use in illustration of a flash writing operation, and FIG. 13 is a timing chart in a flash writing operation.

A description of an operation of the semiconductor memory device shown in FIG. 7 follows. When a usual reading operation is conducted as shown in FIG. 10 and FIG. 11, (1) a row address signal is input to the external terminal 6A. (2) The /RAS signal from the external terminal 6B activates the row decoder 10, and the row address signal is decoded. Thus, a designated row is selected. If the memory cell 1 is divided into a plurality of blocks, one word line 2 in a unit block is selected. (3) The sense amplifier 14 is operated to amplify the potential difference between the bit line 3A and 3B. (4) A column address signal is taken in by activating the column decoder 11 by the /CAS signal, a pair of bit lines 3A and 3B corresponding to the taken in column address signal is selected, thereby turning on the input-/output gate 13, and the potential difference between the bit lines 3A and 3B is transmitted on the input/output line 12. (5) The above-stated potential difference is amplified by the preamplifier 15, and the amplified potential difference is transferred to the main amplifier 16 and output as a data signal to the external terminal 6D.

When a usual writing operation is conducted, a word line corresponding to a row address signal and a bit line corresponding to a column address signal are selected as in the same manner as the above-stated reading operation, and the sense amplifier 14 is activated. A write data signal from the external terminal 6E is taken inside by the /WE signal from the external terminal 6F and transmitted on the input/output line 12 from the input data buffer 17. Thus, the potential difference between the bit line 3A and 3B amplified by the sense amplifier 14 are forced to be the potential difference transmitted on the input/output line 12, and the potential is stored in a selected memory cell.

Other than the usual reading and writing operations, the semiconductor memory device shown in FIG. 7 conducts special operations such as a flash write operation by which the contents of all the memory cells 1 connected to one word line 2 are replaced with the same data in one cycle as shown in FIG. 12 and FIG. 13. In operation at the time of flash write, (1) a row address signal is input to the external terminal 6A, while the DSF signal is input to the external terminal 6G. (2) The row decoder 10 is activated by the /RAS signal from the external terminal 6A, and the row address signal is decoded by the row decoder 10. Thus, one of the word lines 2 in the unit block is selected. (3) The flash write signal generation circuit 22 generates the flash write signal FW in response to the /RAS signal and the DSF signal and provides the generated flash write signal FW to the column decoder 11. This activates the column decoder 11, and all the bit lines 3A and 3B in the unit block are connected en bloc to the input-/output line 12. (4) A data signal registered in an internal register which is not shown, or a data signal input from the external terminal 6E to the input data buffer 17 is transmitted on the input/output line 12. (5) The sense amplifier 14 is operated to amplify the potential difference between the bit lines 3A and 3B, and the amplified potential difference is written into all the memory cells 1 connected to the above-stated one word line 2 as data.

As stated above, the flash write operation is very much different from the usual mode in its logical operation procedure. Especially when a data signal is written in bit lines 3A and 3B from the input/output line 12, only the pair of bit lines 3A and 3B are connected to the output line 12 in the usual mode, but all of the bit lines 3A and 3B in a unit block are connected at the time of the flash write operation, thus increasing load capacity. This is a reason for low operating speed and large power consumption.

As illustrated in FIG. 13, since the sense amplifier 14 attains an active state (100 nsec) and a precharge state (40 nsec) in the same cycle as the /RAS signal, 140 nsec is necessary for flash writing operation for one row.

In order to solve the problem of large power consumption, the use of a memory cell for flash write for each of the memory cells as shown in FIG. 14 has been considered (see Japanese Patent Laying-Open No. 2-189790). The memory cell shown in FIG. 14 includes a second word line 19 provided in parallel to each word line 2, a second bit line 20 provided in parallel to each bit line 3A, a switching transistor 21 provided at the crossing point of the second word line 19 and the second bit line 20, and a switch circuit 22 for applying fixed data (power supply potential or ground potential) to the second bit line 20.

In the memory cell shown in FIG. 14, the second word line 19 activates the switching transistor 21, and fixed data is applied to the second bit line 20. Thus, the flash write and the initialize mode can be executed without utilizing a column decoder.

In the memory cell shown in FIG. 14, however, the area of the memory cell array is increased by the provision of a second word line 19, a second bit line 20 and a switching transistor 21 for each memory cell. This is therefore a room for improvements.

SUMMARY OF THE INVENTION

It is one object of the invention to conduct an operation in a flash write mode at a high speed and with reduced power consumption in a semiconductor memory device.

Another object of the invention is to achieve a flash write mode function in a simple arrangement in a semiconductor memory device.

A semiconductor device includes a plurality of memory cells in a plurality of rows and a plurality of columns each for storing one or the other of first and second information complementary to each other, a plurality of word lines in the plurality of rows and each connected to a plurality of memory cells provided to a corresponding row, a plurality of bit line pairs in a plurality of columns and each connected to a plurality of memory cells provided to a corresponding column, and a plurality of sense amplifiers in the plurality of columns and each connected to bit line pairs provided to a corresponding column for amplifying the potential difference appearing between bit line pairs.

A method of flash writing the same information to a plurality of cells in a con, non row simultaneously includes the steps of selecting one of the plurality of word lines, applying a prescribed potential only to one bit line of each of the plurality of bit line pairs for writing the first or second information to the memory cells connected to the selected word line, and generating a signal for maintaining the plurality of sense amplifiers in an active state until a flash writing operation is completed.

In operation, a flash writing operation is performed by applying a prescribed potential only to one bit line of each of the plurality of bit line pairs, and therefore power consumption can be reduced as compared to the case using a column decoder. Furthermore, by maintaining the plurality of sense amplifiers in an active state until a flash writing operation is completed, a cycle for precharging the sense amplifiers is not necessary, and therefore time required for a flash writing operation can be reduced.

More simply stated, a semiconductor memory device according to the invention includes a plurality of memory cells, a plurality of word lines, a plurality of bit line pairs, a plurality of sense amplifiers, and a flash write circuit. The plurality of memory cells are arranged in a matrix of a plurality of rows and a plurality of columns and each for storing first information or second information. The plurality of word lines are arranged in a plurality of rows and each connected to a plurality of memory cells provided to a corresponding row. The plurality of bit line pairs are provided in a plurality of columns and each connected to a plurality of memory cells provided to a corresponding column. When the flash write circuit writes the first or second information in a plurality of memory cells connected to a selected one of the plurality of word lines in response to a flash write designation signal, it applies a prescribed potential to one bit line of the bit line pair. The sense amplifier activation circuit generates a signal for maintaining the plurality of sense amplifiers in an active state, in response to an output signal from the flash write circuit, until the flash writing operation is completed.

In operation, the flash write circuit applies a prescribed potential only to one bit line of each of the plurality of bit line pairs in response to the flash write designation signal. The plurality of sense amplifiers amplify the prescribed potential applied to the bit line and applies the amplified potential to the memory cells connected to the selected word line. As a result, the flash writing operation can be performed without utilizing a column decoder. By keeping the plurality of sense amplifiers in an active state until the flash writing operation is completed, a cycle for precharging the sense amplifiers is not necessary, and therefore time required for flash writing can be reduced. Thus, the flash write operation can be connected without the use of a column decoder.

A semiconductor memory device in accordance with another aspect of the invention includes a plurality of memory cells, a plurality of word lines, a plurality of bit line pairs, a plurality of sense amplifiers, a first selection line for flash write, a second selection line for flash write, a first switching circuit, and a second switching circuit. The plurality of memory cells are arranged in a plurality of rows and a plurality of columns and each for storing first information or second information. The plurality of word lines are arranged in a plurality of rows and each connected to a plurality of memory cells provided to a corresponding row. The plurality of bit line pairs are arranged in a plurality of columns and each connected to a plurality of memory cells provided to a corresponding column. The plurality of sense amplifiers are arranged in a plurality of columns and each connected to bit line pairs provided to a corresponding column.

The first selection line for flash write is arranged in parallel to the word lines and provided with a first flash write signal. The second selection line for flash write is arranged in parallel to the word lines and provided with a second flash write signal. The first switching circuit is connected between one bit line of each of the plurality of bit line pairs and a prescribed potential node and has its control electrode connected to the first selection line for flash write.

The second switching circuit is connected between the other bit line of each of the plurality of bit line pairs and the prescribed potential node and has its control electrode connected to the second selection line for flash write.

In operation, the first flash write signal is applied to the control electrodes of a plurality of transistors belonging to the first switching circuit through the first selection line for flash write. The transistors are in response turned on en block, pulling one bit line of each of the plurality of bit line pairs to the prescribed potential. Meanwhile, the second flash write signal is applied to the control electrodes of a plurality of transistors belonging to the second switching circuit through the second selection line for flash write. The transistors are in response turned on en block, pulling the other bit line of each of the plurality of bit line pairs to the level of the prescribed potential node. Thus, the flash write operation can be conducted without requiring a column decoder.

Furthermore, since the first and second selection lines for flash write are provided in parallel to the word lines, the first switching circuit is connected to the first selection line for flash write, and the second switching circuit is connected to the selection line for flash write, the number of necessary interconnections and transistors can greatly be reduced as compared to conventional examples.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the invention will be described in conjunction with the drawings.

Figure 1:
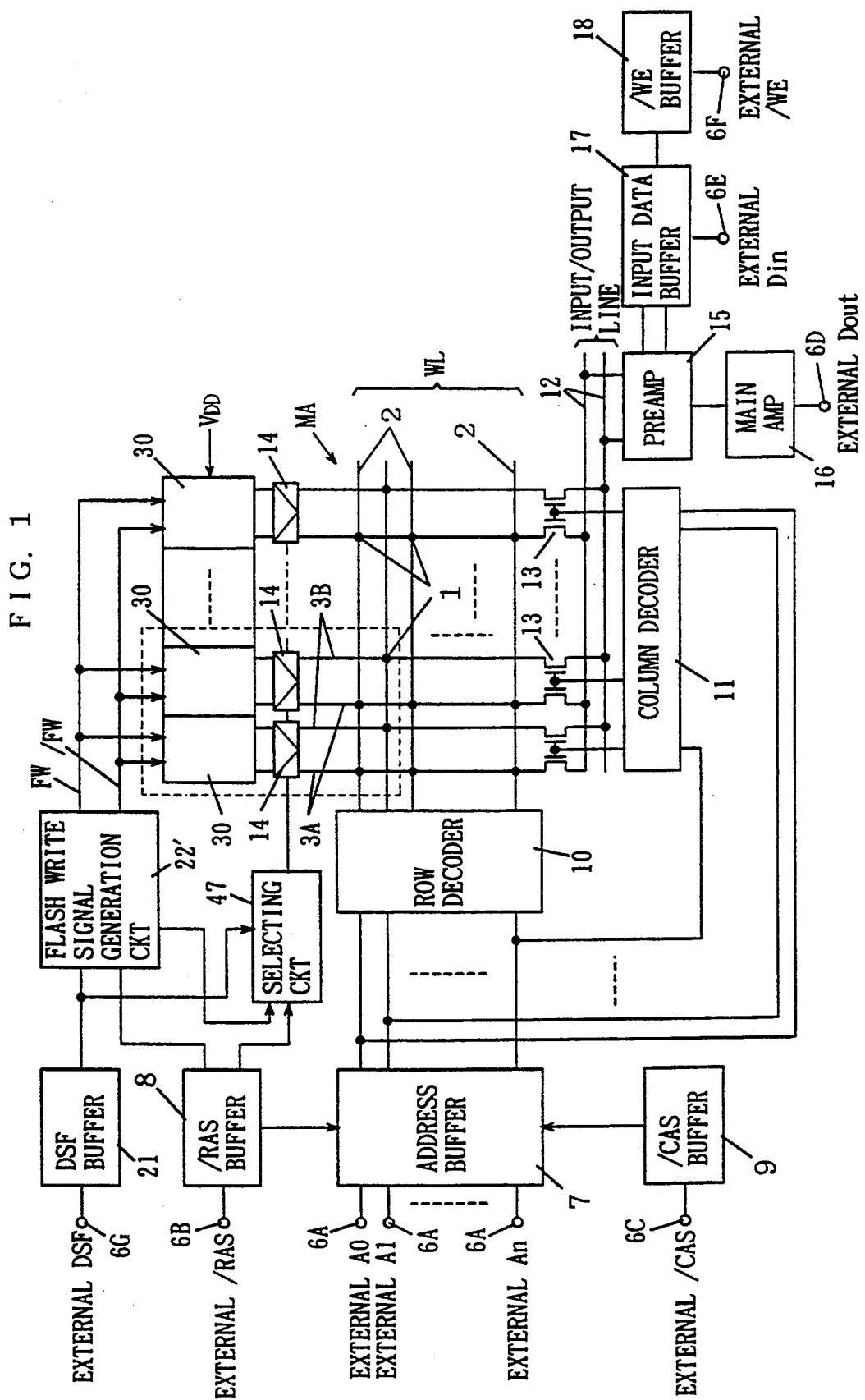
FIG. 1 is a block diagram showing one embodiment of a semiconductor memory device in accordance with the invention.
Figure 7:
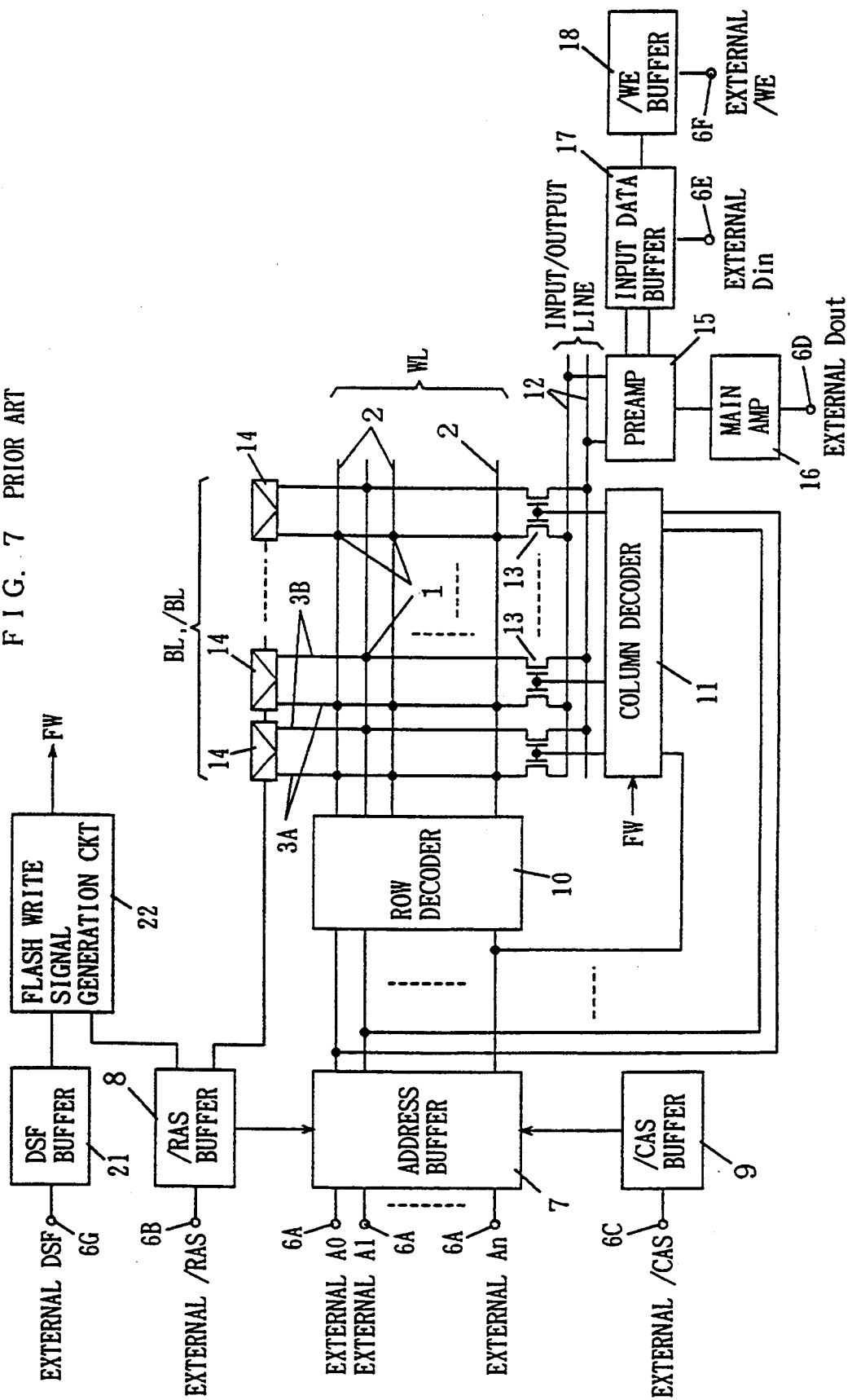
FIG. 7 is a block diagram showing a conventional semiconductor memory device.

FIG. 1 is a block diagram showing one embodiment of a semiconductor memory device in accordance with the invention. The following differences reside between the semiconductor memory device in FIG. 1 and the semiconductor memory device in FIG. 7. More specifically, the semiconductor memory device in FIG. 1 includes a flash write signal generation circuit 22 for generating a flash write signal FW for writing "1" at a time in memory cells in a row, and a flash write signal /FW for writing "0" at a time in memory cells in a row, a plurality of switching circuits 30 conducting in response to the flash write signal FW or /FW and a selecting circuit 47 for selecting the output of the /RAS buffer 8 in a usual operation mode and selecting the flash write signal FW in a flash write mode and applying the selected signal to the sense amplifier 14 as a sense amplifier activation signal. The column decoder 11 is not provided with the flash write signal FW, unlike the column decoder shown in FIG. 7. The configuration of the rest of the circuit is substantially identical to the semiconductor memory device shown in FIG. 7, and attached with the same reference numerals, and the description thereof will be omitted from time to time.

Figure 2:
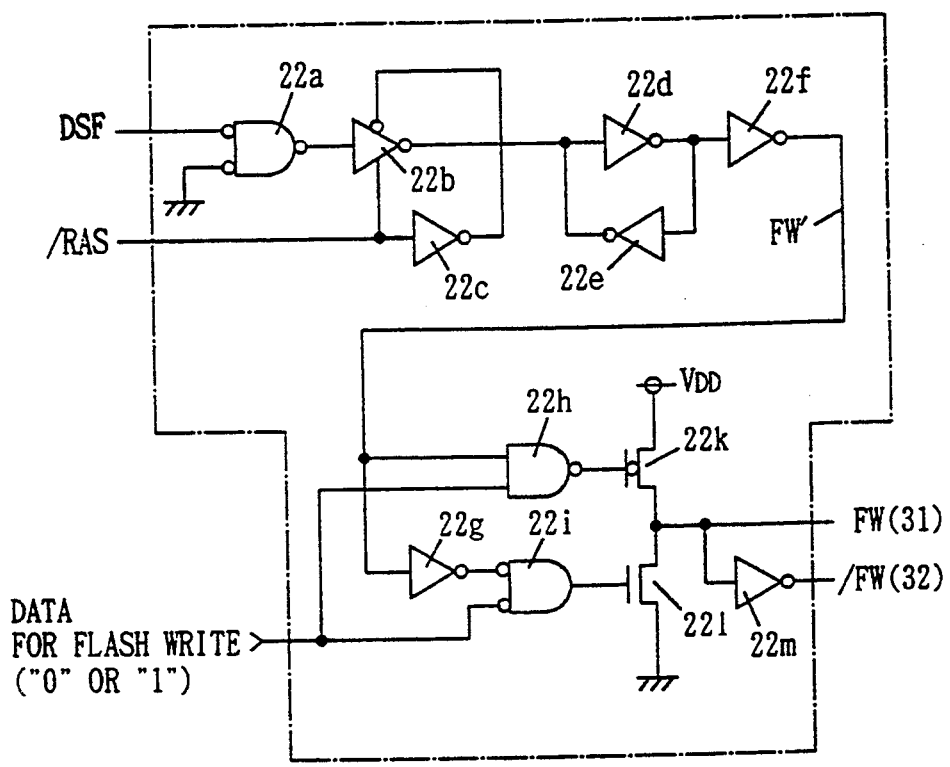
FIG. 2 is a circuit diagram showing a flash write signal generation circuit shown in FIG. 1.
Figure 2:
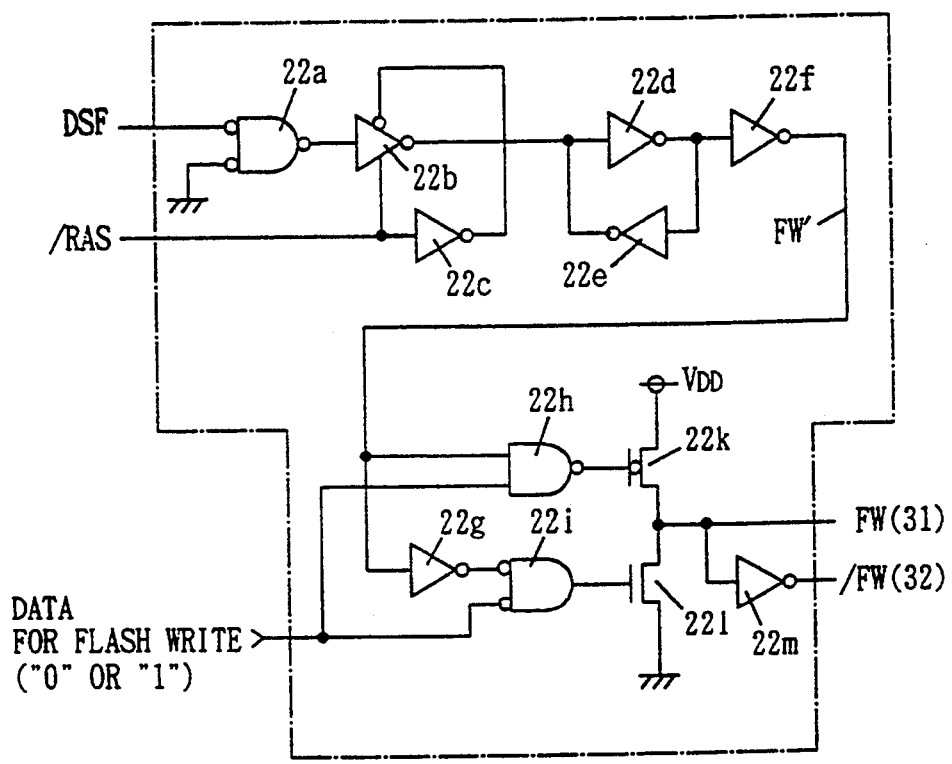
Figure 8:
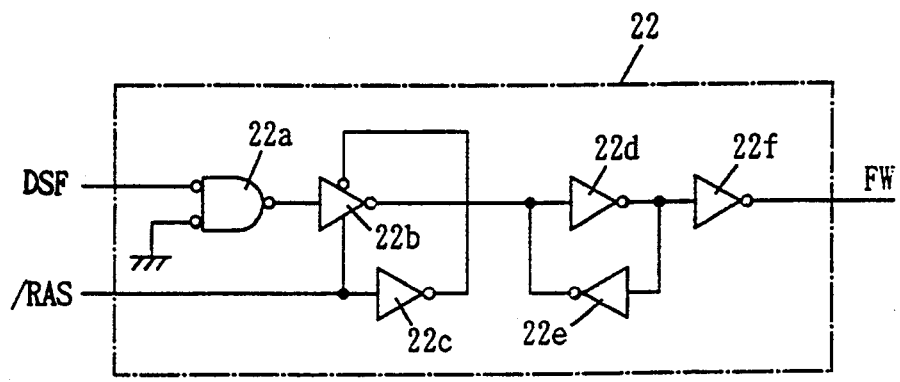
FIG. 8 is a circuit diagram showing a flash write signal generation circuit shown in FIG. 7.
Figure 9:
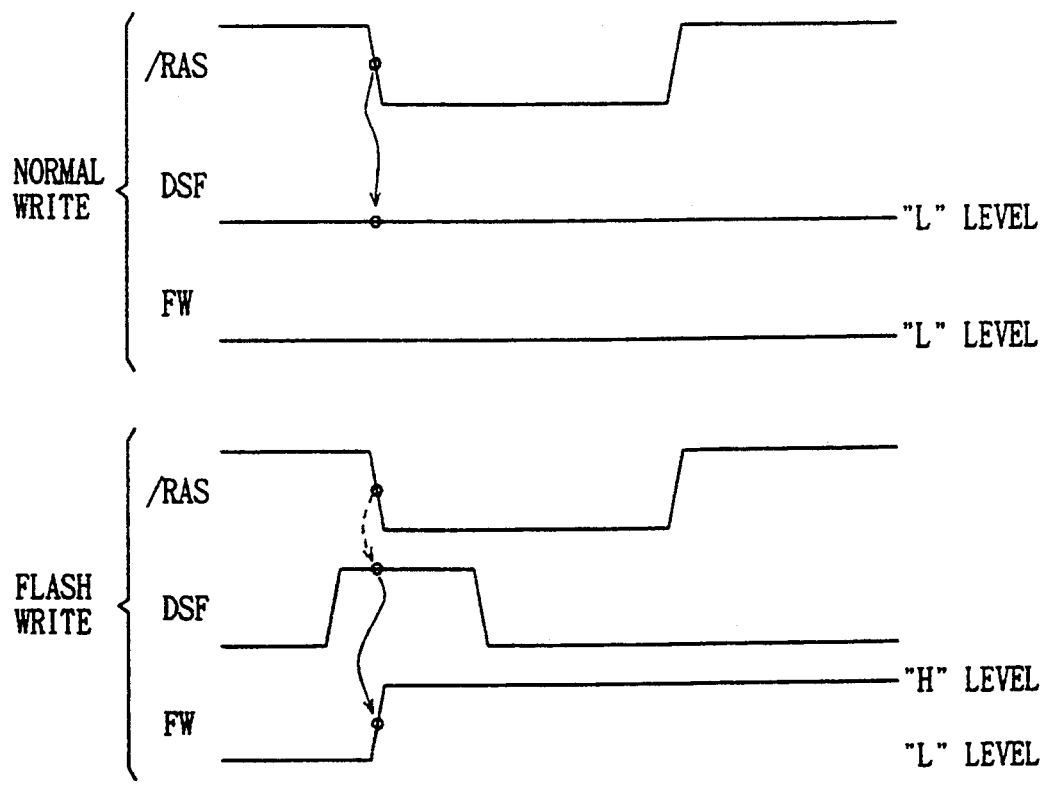
FIG. 9 is a timing chart for use in illustration of the flash write signal generation circuit shown in FIG. 8.
Figure 10:
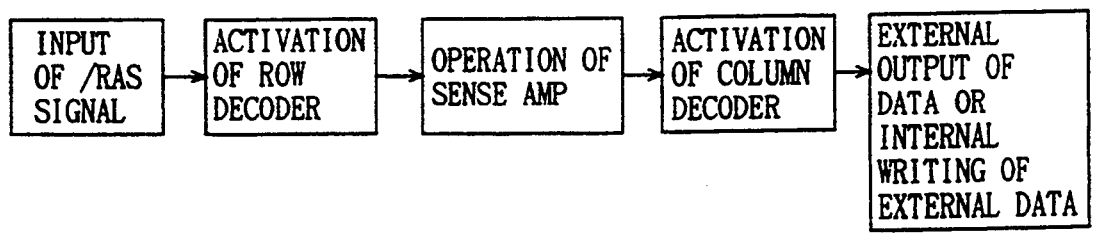
FIG. 10 is a flow chart for use in illustration of a usual writing operation by the semiconductor memory device shown in FIG. 7.
Figure 11:
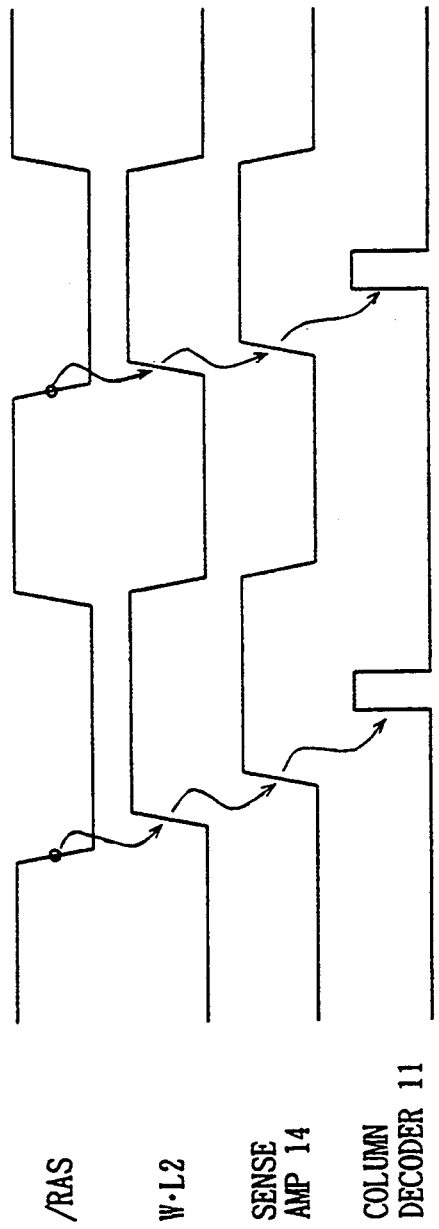
FIG. 11 is a timing chart for use in illustration of a NORMAL WRITE operation of the DRAM in FIG. 7.
Figure 12:
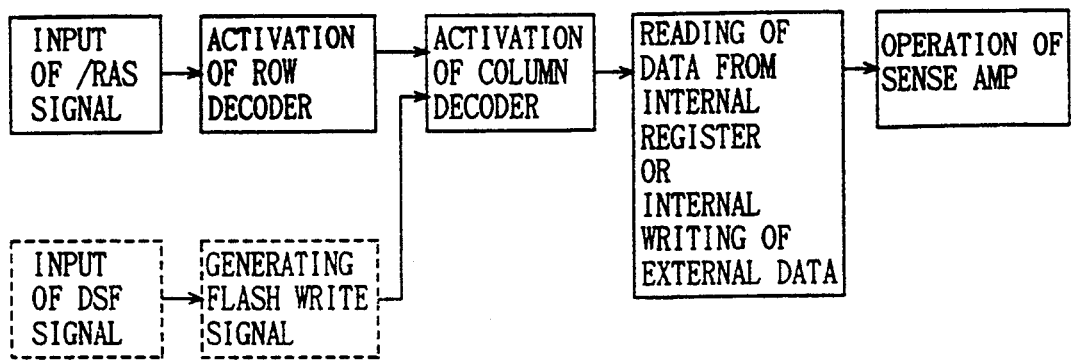
FIG. 12 is a flow chart for use in illustration of a flash write operation by the semiconductor memory device shown in FIG. 7.
Figure 13:
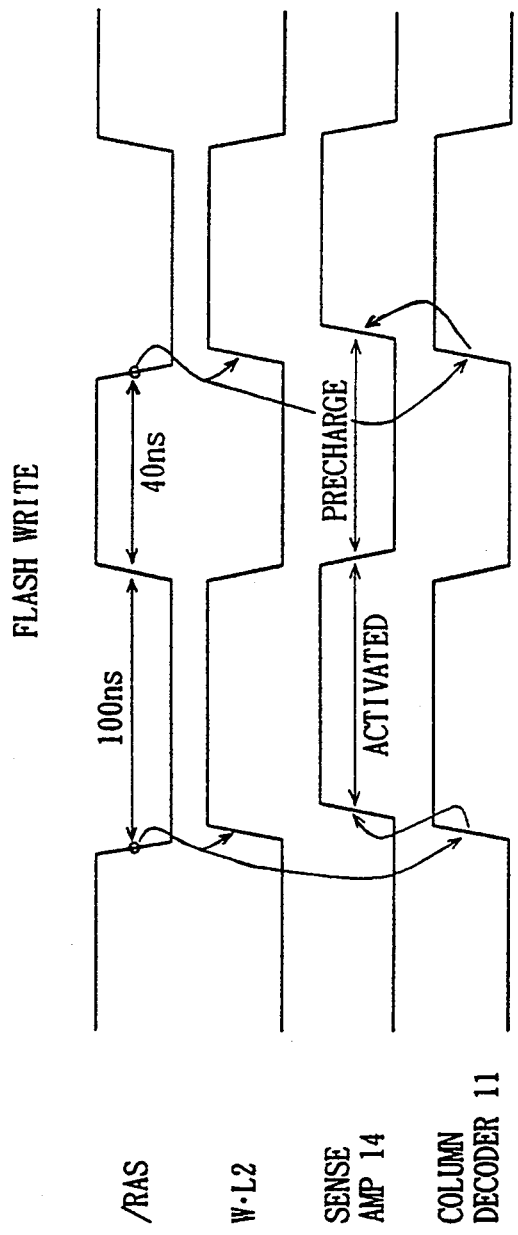
FIG. 13 is a timing chart for use in illustration of a FLASH WRITE operation of the DRAM shown in FIG. 7.
Figure 14:
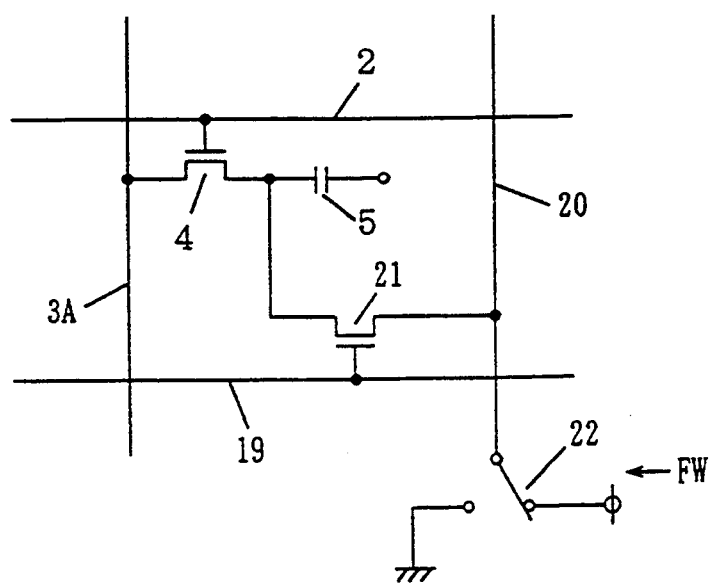
FIG. 14 is a circuit diagram showing a conventional semiconductor device capable of a flash write operation, etc. without using a column decoder.

FIG. 2 is a circuit diagram showing a flash write signal generation circuit 22' shown in FIG. 1. Referring to FIG. 2, the flash write signal generation circuit 22' includes in addition to the circuit 22 shown in FIG. 8, inverters 22g and 22m, gate circuits 22h and 22i, a PMOS transistor 22k, and an NMOS transistor 22l.

In operation, the circuit drives a flash write bus 31 (FIG. 3) to attain a high level and a flash write bus 32 to attain a low level when data for flash writing is "1", and drives the flash write bus 31 to attain a low level and flash write bus 32 to attain a high level when data for flash writing is "0".

Figure 3:
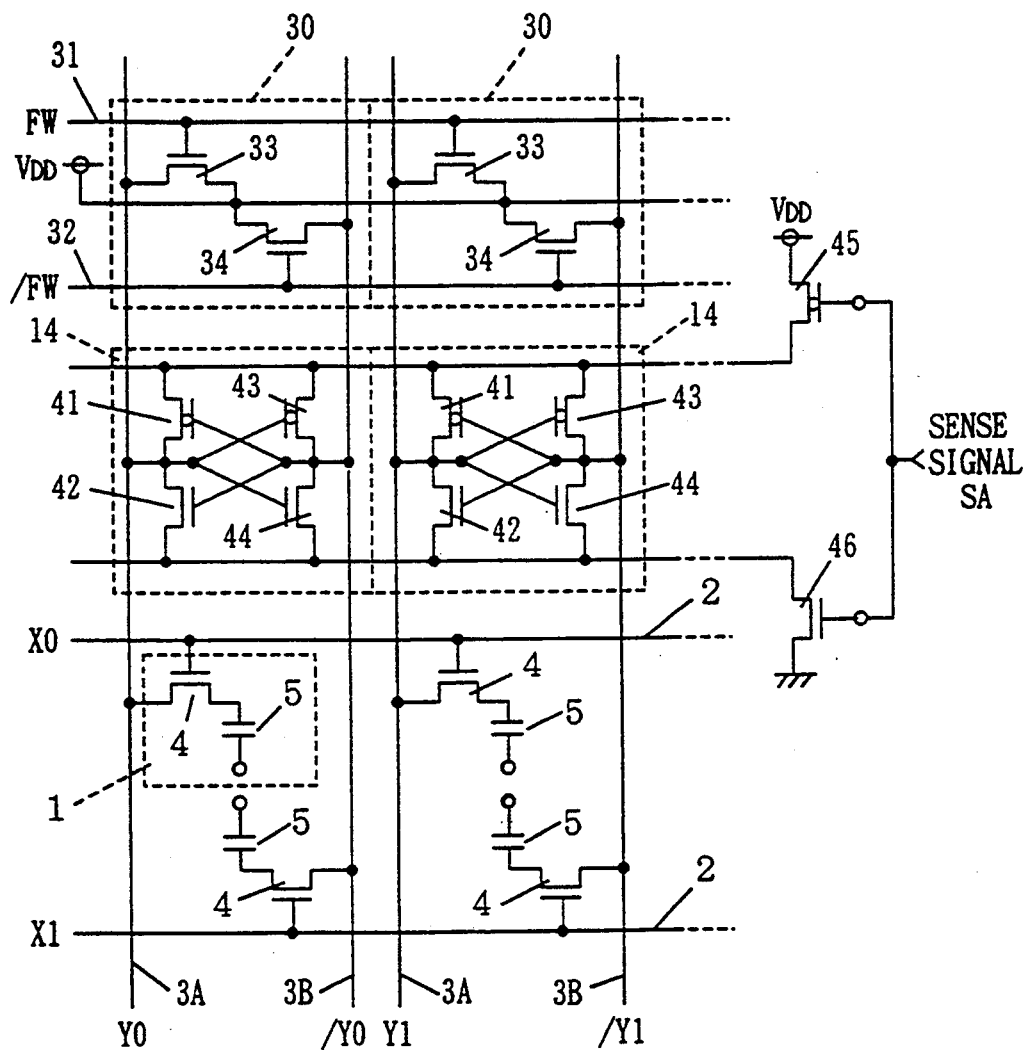
FIG. 3 is a circuit diagram showing in detail a switching circuit 30, a sense amplifier 14, and a memory cell 1 in the semiconductor memory device shown in FIG. 1.

FIG. 3 is an enlarged circuit diagram showing the part surrounded by the dotted line in the semiconductor memory device shown in FIG. 1, illustrating in detail the switching circuit 30, the sense amplifier 14, and the memory cell 1.

Referring to FIG. 3, X0 and X1 are word lines for activating the first row and the second row in a memory cell array MA. Y0 and /Y0 are bit lines connected to a memory cells 1 in the first column in the memory cell array MA, while Y1 and /Y1 are bit lines connected to a memory cells 1 in the second column in the memory cell array MA.

Each memory cell 1 includes a word line 2, a transistor 4 provided at a crossing point of a bit line 3A or 3B and the word line 2, and a capacitor 5 for holding data. The transistor 4 has its source electrode connected to the bit line 3A or 3B, its drain electrode connected to one end of the capacitor 5, and its gate electrode connected to the word line 2.

Each switching circuit 30 includes a flash write line 31 to which the flash write signal FW is transferred, a flash write line 32 to which the flash write signal /FW is transferred, and transistors 33 and 34. The transistor 33 has its gate electrode connected to the flash write line 31, its source/drain electrode connected to the bit line 3A and its the other source/drain electrode connected to a power supply terminal VDD. The transistor 34 has its gate electrode connected to the flash write line 32, its source/drain electrode connected to the bit line 3B, and its the other source/drain electrode to the power supply terminal $V_{DD}$.

The flash write lines 31 and 32 parallel to the word line 2 are formed of the same material as and in the same procedure as the word lines 2. The flash write lines 31 and 32 are provided in an insulating layer formed on the channels of the transistors 33 and 34. The gate electrodes of the transistors 33 and 34 are formed of parts of the flash write lines 31 and 32. More specifically, the flash write lines 31 and 32 are integrally formed with the gate electrodes of the transistors 33 and 34. Accordingly, since a circuit for implementing the flash write function is provided in an area for memory cells in at least two rows by reduced elements and simple structure, the area occupied by the circuit will be reduced as compared to conventional examples.

The sense amplifier 14 includes PMOS transistors 41, 43, and 45, and NMOS transistors 42, 44, and 46. The PMOS transistors 41, 43 have their source electrodes connected together to the drain electrode of the PMOS transistor 45. The NMOS transistors 42 and 44 have their source electrodes connected together to the drain electrode of the NMOS transistor 46. The PMOS transistor 41 and the NMOS transistor 42 have their gate electrodes and their drain electrodes connected together to a bit line 3B and a bit line 3A, respectively. The PMOS transistor 43 and the NMOS transistor 43 have their gate electrodes and the drain electrodes connected together to the bit line 3A and the bit line 3B, respectively. More specifically, the PMOS transistor 41 and the NMOS transistor 42, and the PMOS transistor 43 and the NMOS transistor 44 are connected in a complementary manner and force the potentials of the bit lines to be the level of the power supply potential or the ground potential when a potential difference is generated between the bit lines 3A and 3B. The PMOS transistor 45 and the NMOS transistor 46 are activated in response to an externally generated sense signal, activating a differential amplification circuit formed of a PMOS transistor and an NMOS transistor.

A description of an operation of the circuit shown in FIG. 3 follows. When "1" is written in a memory cell corresponding to an X0 row, the transistors 33 are activated en bloc, because the flash write signal FW is pulled to a high level. Thus, the power supply terminal $V_{DD}$ and the bit line 3A are connected, and a potential difference is generated between the bit lines 3A and 3B. The potential difference is detected and amplified by the sense amplifier 14. This allows the potential of the bit line 3A to be increased to a level as high as the power supply potential and the potential of the bit line 3B to be lowered to the level of the ground potential. Assuming that the word line 2 of the X0 row is activated, the potential of the bit line 3A is applied to the capacitor 5 through the transistor 4 of the memory cell 1 and held in the capacitor 5. Thus, "1" is written in all the memory cells belonging to the X0 row en block.

When "0" is written in the memory cells of the X0 row, the flash write signal /FW is pulled to a high level, thus activating the transistor 34. Thus, the power supply terminal $V_{DD}$ and the bit line 3B are connected, generating a potential difference between the bit lines 3A and 3B. The sense amplifier 14 amplifies the potential difference, bringing the potential of the bit line 3A into the ground level and the potential of the bit line 3B to the power supply potential. Thus, the voltage signal pulled to the ground level is transferred to all the memory cells belonging to the selected X0 row through the bit line 3A. Accordingly, "0" will be written in all the memory cells belonging to the X0 row. Although the transistors 33 and 34 shown in FIG. 2 are connected to the power supply terminal $V_{DD}$, they may be connected to the ground terminal instead of the power supply terminal. In that case, data to be written "1" and "0" will be reversed from the above-stated embodiment.

Figure 4:
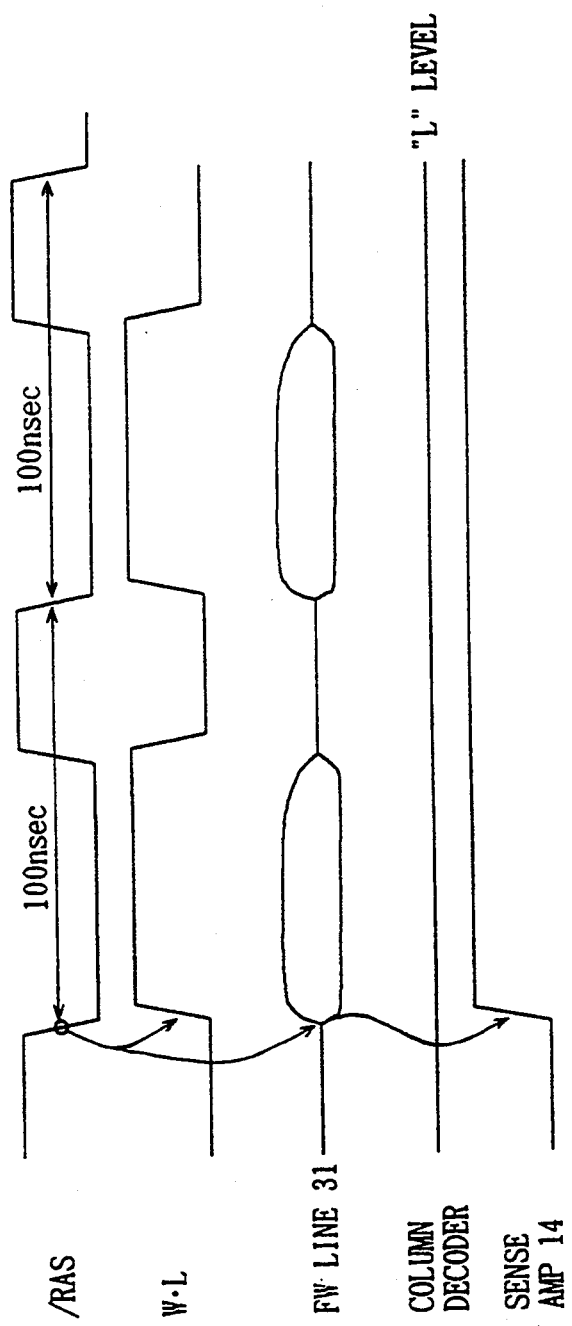
FIG. 4 is a timing chart for use in illustration of a semiconductor memory device shown in FIGS. 1 to 3.

FIG. 4 is a timing chart for use in illustration of the DRAM shown in FIGS. 1 to 3.

Now, an operation of the entire semiconductor memory device shown in FIGS. 1, 2, 3 and 4 follows.

When the flash write mode or the initialized mode are designated, a row address signal is applied to the external terminal 6A, the /RAS signal is applied to the external terminal 6B, and the DSF signal is applied to the external terminal 6G. The address buffer 7 holds the row address signal from the external terminal 6A and applies the signal to the row decoder 10 in response to a row address strobe signal /RAS from the RAS buffer 8. The row decoder 10 responds to the applied row address signal and selects one word line 2. The memory cell 1 on the selected word line 2 is activated.

The DSF signal applied to the external terminal 6G is provided to the DSF buffer 21, and after changing the level of the signal therein, the signal is applied to the flash write signal generation circuit 22. The flash write signal generation circuit 22 generates the flash write signal FW or /FW in response to the DSF signal and the row address strobe signal /RAS from the RAS buffer 8. When "1" is written in a memory cell, the flash write signal WF is pulled to a high level, and when "0" is written, the flash write signal /FW is pulled to a high level. Upon receiving the high level flash write signal FW or /FW, the plurality of switching circuits 30 are activated en block.

As stated above, after the word line 2 desired to be written in and the switching circuit 30 for flash write are activated, the sense amplifiers are activated by the signal SA from the selecting circuit 47. The potential difference between the bit lines 3A and 3B is amplified by the sense amplifier 14, and the flash write operation is completed.

Since the sense amplifier 14 is activated during the period in which the flash write signal FW is output, a cycle for precharging the sense amplifiers 14 is not necessary and therefore time required for flash writing can be reduced by about 40 nsec.

As the image processing technology has developed in recent years, development of techniques such as color display on the CRT of a personal computer, three-dimensional display in a CAD system, expansion and reduction of an image, multi-windows for a picture plane, and improvement of resolution have rapidly advanced. In addition, computer graphics for displaying results of calculation of values by a super computer has attracted much attention. Under the circumstances, various kinds of video memory devices for storing digital image signals have been developed. A dual-port memory device is known as an optimized random access memory for storing image data and permits random accessing and serial accessing at any time.

Figure 5:
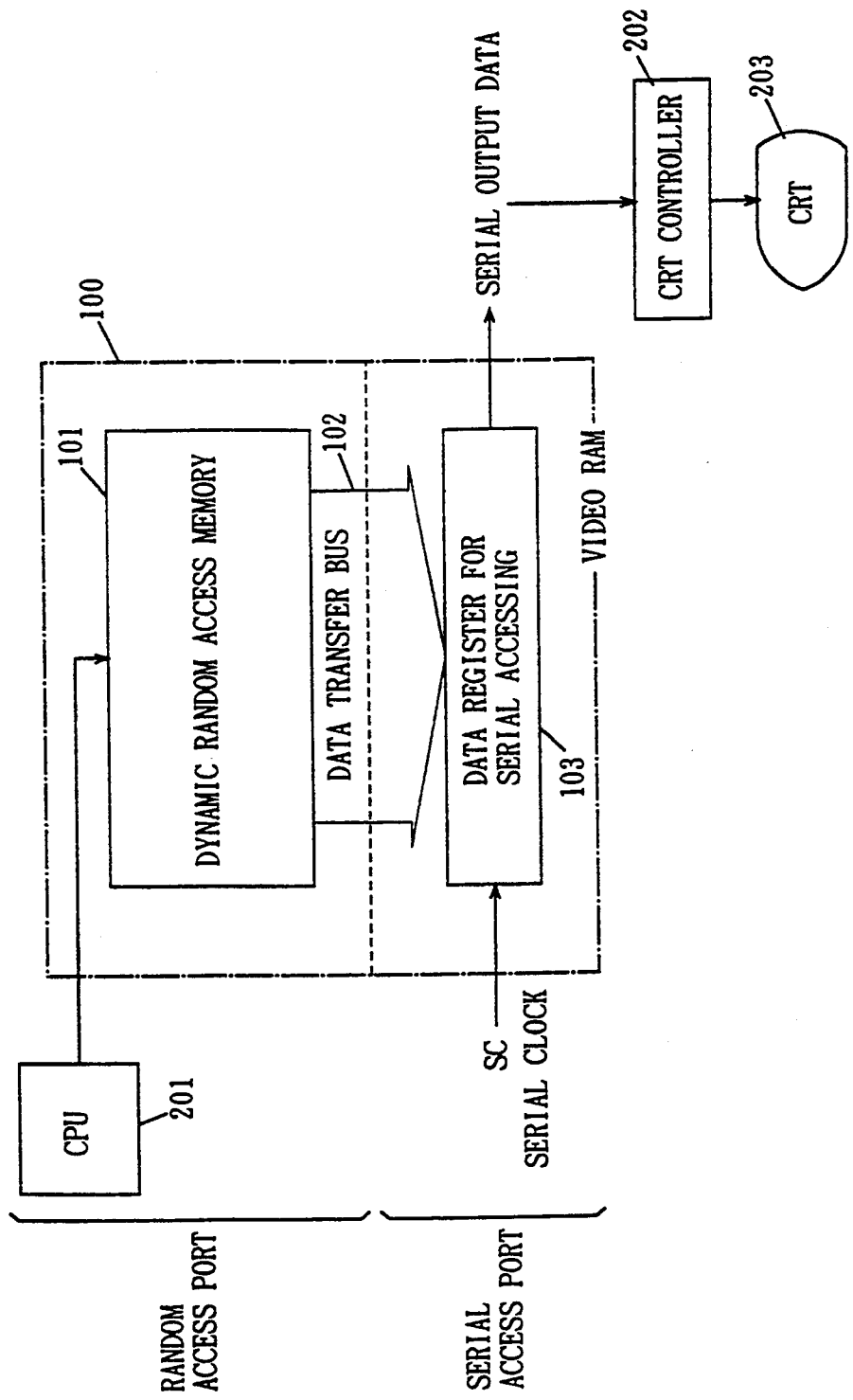
FIG. 5 is a block diagram schematically showing a video RAM to which a semiconductor memory device of the invention is applied.

FIG. 5 is a diagram schematically showing a dual port memory. Referring to FIG. 5, the dual port memory has a structure as shown in FIGS. 1 through 3, and includes a randomly accessible dynamic memory cell array 101 for storing image data, a data transfer bus 102 for transferring data read out from the memory cell array 101, and a data register for serial accessing 103. The dynamic memory cell array 101 is connected to a CPU (Central Processing Unit) 201 through a random access port and randomly accessed by the CPU 201.

Meanwhile, the data register for serial accessing 103 serially outputs image data read out through the data transfer bus 102, in response to an externally applied serial clock signal SC. The output serial data is applied to a CRT controller 202, and an image based on the output serial data is displayed on the CRT 203.

Figure 6:
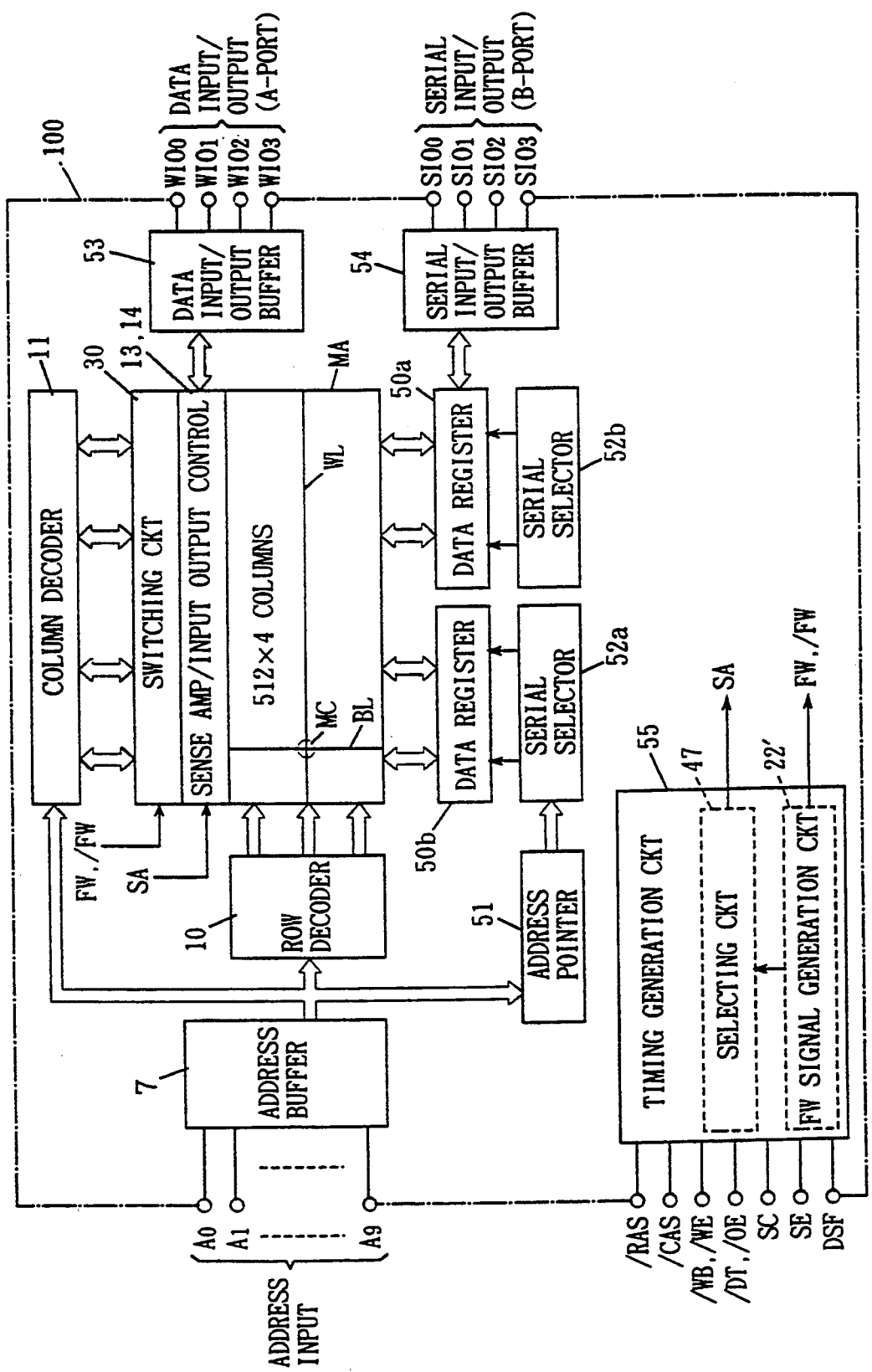
FIG. 6 is a block diagram showing the semiconductor memory device (DRAM) shown in FIG. 1 applied to the video RAM in FIG. 5.

FIG. 6 is a block diagram showing the structure of the dual port memory shown in FIG. 5.

Referring to FIG. 5, the dual port memory includes a memory cell array MA including memory cells MC arranged in a matrix, an address buffer 7 for receiving an external address signal, a row decoder 10 for designating a word line WL in response to row address signals AX0–AX7, a sense amplifier 14 for amplifying a data signal read out from a designated memory cell, data registers 50a and 50b for holding the amplified data signal, an address pointer 51 for generating internal address signals SY0 to SY7 for serial output based on initial addresses SA0 to SA7 applied from the address buffer 7, and serial selectors 52a and 52b for designating a serial register in response to a generated internal address signal. The random access port (A-Port) is connected to a data input/output buffer 53. Meanwhile, the serial access port (B-Port) is connected to a serial input/output buffer 54.

Input to a timing generation circuit 55 are a row address strobe signal /RAS, a column address strobe signal /CAS, a write bit signal /WB, a write designation signal WE, a data transfer signal /DT, an output enable signal /OE, a serial control signal SC, a serial enable signal SE, and a DSF (Data-in Special Flag) signal. The timing generation circuit 55 generates a necessary control timing signal in response to each of these externally applied signals. The DSF signal is a signal for designating writing of the same data at a time in a row of memory cells. The timing generation circuit 55 generates a flash write signal in response to the DSF signal.

Now, an operation will briefly be described. A memory cell designated by the address signals AX and AY is randomly accessed through the random access port, in other words, a parallel data input and parallel data output WIO. Meanwhile, serial data is input/output in response an internal address signal generated by address pointer 51 through the serial access port, in other words a serial data input and serial data output SIO.

When a flash writing operation is performed, the same operation as the description of the DRAM in FIG. 1 is performed. More specifically, the DSF signal is applied to the FW signal generation circuit 22' through a DSF terminal. The FW signal generation circuit 22' generates an FW signal and an /FW signal in response to the DSF signal and the /RAS signal, and applies the generated signals to a switching circuit 30 and the selecting circuit 47. The selecting circuit 47 selects the FW signal and applies the same to the sense amplifier 14, thereby activating the sense amplifier 14. The switching circuit 30 applies a power supply potential to one bit line of each of the plurality of bit line pairs in response to the FW signal and the /FW signal. As a result, the same data can be written in a plurality of memory cells connected to the word line WL selected by the row decoder 10. Since the writing operation does not utilize a column decoder, and therefore power consumption can be reduced. Furthermore, the sense amplifier 14 is maintained in an active state until the flash writing operation is completed, time required for flash writing can be reduced. Particularly in video RAMs, it is necessary to process a large amount of data in a short period of time, and therefore reduction of time required for flash writing is advantageous.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. For a semiconductor device comprising a plurality of memory cells in a plurality of rows and a plurality of columns each for storing one or the other of first and second information complementary to each other, a plurality of word lines in the plurality of rows and each connected to a plurality of memory cells provided to a corresponding row, a plurality of bit line pairs in the plurality of columns and each connected to a plurality of memory cells provided to a corresponding column, and a plurality of sense amplifiers in the plurality of columns and each connected to bit line pairs provided to a corresponding column for amplifying the potential difference appearing between the bit line pairs,
   a method of flash writing the same information to a plurality of cells in a common row simultaneously, comprising the steps of:
   selecting one of the plurality of word lines;
   applying a prescribed potential only to one bit line of each of the plurality of bit line pairs for writing the first or second information to memory cells connected to the selected word line; and
   generating a sense amplifier activation signal for maintaining the plurality of sense amplifiers in an active state until a flash writing operation is completed.

2. A method of flash writing as recited in claim 1, wherein
   said step of selecting one of the plurality of word lines includes the steps of:
   detecting a row address signal in response to a row address strobe signal;
   decoding the detected row address signal; and activating a word line corresponding to the decoded row address signal.

3. A method of flash writing as recited in claim 1, wherein
   said step of applying the prescribed potential to only one bit line of each of the plurality of bit line pairs includes:
   receiving an externally applied flash write designation signal;
   generating a flash write control signal for controlling flash writing in response to said received flash write designation signal; and
   generating first and second signals corresponding the first or second information for flash writing and having a complementary relation to each other, in response to said generated flash write control signal.

4. A method of flash writing as recited in claim 3, wherein
   said step of applying the prescribed potential to only one bit line of each of the plurality of bit line pairs further includes a step of turning on/off between a node having said prescribed potential and said plurality of bit line pairs, in response to said generated first and second control signals.

5. A method of flash writing as recited in claim 1, wherein said step of generating the sense amplifier activation signal includes a step of applying a prescribed potential to said plurality of sense amplifiers, in response to a flash write control signal.

6. A semiconductor memory device, comprising:
   a plurality of memory cells provided in a plurality of rows and a plurality of columns each for storing one of first information and second information;
   a plurality of word lines provided in the plurality of rows and each connected to a plurality of memory cells provided to a corresponding row;
   a plurality of bit line pairs provided in the plurality of columns and each connected to a plurality of memory cells provided to a corresponding column;
   a plurality of sense amplifiers provided in the plurality of columns and each connected to bit line pairs provided to a corresponding column for amplifying the potential difference appearing between the bit line pairs;
   flash write means for applying a prescribed potential only to one bit line of each of the plurality of bit line pairs when it writes the first or second information in a plurality of memory cells connected to the selected one of the plurality of word lines, upon receiving a flash write designation signal; and
   sense amplifier activation signal generation means responsive to the flash write means for generating a signal for maintaining said plurality of sense amplifiers in an active state until a flash write operation is completed.

7. A semiconductor memory device as recited in claim 6, comprising,
   state control signal receiving means for receiving a state control signal for controlling a storage state,
   a row decoder responsive to an input row address signal for selecting one of said plurality of word lines,
   a column decoder responsive to an input column address signal for selecting one bit line pair of said plurality of bit line pairs, and
   input/output means for outputting data read out from each said memory cell and inputting input data.

8. A semiconductor memory device as recited in claim 6, wherein
   said semiconductor memory device includes,
   serial writing means for serially writing input data in said plurality of memory cells, and
   serial reading means for serially reading data stored in said plurality of memory cells.

9. A semiconductor memory device as recited in claim 6, wherein
   said prescribed potential is a potential of a power supply voltage.

10. A semiconductor memory device as recited in claim 9, wherein
    said flash write means includes,
    flash write designation signal receiving means for receiving said flash write designation signal,
    flash write signal generation means responsive to said received flash write designation signal for generating first and second flash write signals in a complementary relation with each other, and
    a plurality of voltage supply means responsive to said generated first and second flash write signals for supplying said prescribed potential to a corresponding bit line pair.

11. A semiconductor memory device as recited in claim 10, wherein
    each said voltage supply means includes first and second transistors each including a control electrode, one electrode, and the other electrode,
    said first transistor having its control electrode connected to receive said first flash write signal, its one electrode connected to one bit line of said corresponding bit line pair, and its the other electrode together with the other electrode of said second transistor connected to said prescribed potential, said second transistor having its control electrode connected to receive said second flash write signal, and its one electrode connected to the other bit line of said corresponding bit line pair.

12. A semiconductor memory device as recited in 6, wherein said sense amplifier activation signal generation means includes, selection means connected to receive a row address strobe signal and an internally generated flash write control signal for selecting the row address strobe signal at the time of usual operation and selecting the flash write control signal in response to the flash write designation signal, first switching means connected between the power supply node and said plurality of sense amplifiers and responsive to the flash write control signal selected by said selection means for being turned on, and second switching means connected between a ground node and said plurality of sense amplifiers and responsive to the flash write control signal selected by said selection means for being turned on.

13. A semiconductor memory device, comprising:

memory cells arranged in a plurality of rows and a plurality of columns;

a plurality of word lines provided in the plurality of rows and each connected to a plurality of memory cells provided to a corresponding row;

a plurality of bit line pairs arranged in the plurality of columns and each connected to a plurality of memory cells provided to a corresponding column;

a plurality of sense amplifiers provided in the plurality of columns and each connected to a bit line pair provided to a corresponding column for amplifying a potential difference appearing between the bit line pair;

a first selection line for flash write provided in parallel to said word lines and supplied with a first flash write signal;

a second selection line for flash write provided in parallel to said word lines and supplied with a second flash write signal;

first switching means connected between one bit line of each of said plurality of bit line pairs and a prescribed node and including a plurality of transistors having their control electrodes connected to said first selection line for flash write; and second switching means connected between the other bit line of each of said plurality of bit line pairs and the prescribed node and including a plurality of transistors having their control electrodes connected to said second selection line for flash write.

14. A semiconductor memory device, as recited in claim 13, comprising as peripheral circuitry:

state control signal receiving means for receiving a state control signal for controlling a storage state;

a row decoder responsive to an input row address signal for selecting one of said plurality of word lines;

a column decoder responsive to an input column address signal for selecting one bit line pair of said plurality of bit line pairs;

input/output means for outputting data read out from each said memory cell and inputting input data;

flash write designation signal receiving means for receiving a flash write designation signal; and flash write signal generation means responsive to said received flash write designation signal for generating the first and second flash write signals in a complementary relation with each other.

15. A semiconductor memory device as recited in claim 14, wherein said semiconductor memory device includes, serial writing means for serially writing input data in said plurality of memory cells, and serial reading means for serially reading out data stored in said plurality of memory cells.

16. A semiconductor memory device as recited in claim 13, wherein said prescribed potential node is pulled to the power supply voltage.

17. A semiconductor memory device as recited in claim 13, wherein said first and second selection lines for flash write are formed of the same material as each said word line and constitute the control electrode of each transistor included in said first and second switching means.

* * * * *